(12) United States Patent
Escher et al.

(10) Patent No.: US 7,560,376 B2
(45) Date of Patent: Jul. 14, 2009

(54) METHOD FOR ADJOINING ADJACENT COATINGS ON A PROCESSING ELEMENT

(75) Inventors: Gary Escher, Hampstead, NH (US);
Mark A. Allen, Essex, MA (US);
Yasuhisa Kudo, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 332 days.

(21) Appl. No.: 10/550,416

(22) PCT Filed: Mar. 17, 2004

(86) PCT No.: PCT/US2004/006077

§ 371 (c)(1),
(2), (4) Date: Aug. 3, 2006

(87) PCT Pub. No.: WO2004/095530

PCT Pub. Date: Nov. 4, 2004

(65) Prior Publication Data

US 2007/0142956 A1    Jun. 21, 2007

Related U.S. Application Data

(60) Provisional application No. 60/458,407, filed on Mar. 31, 2003.

(51) Int. Cl.
*H01L 21/4763* (2006.01)
*H01L 21/311* (2006.01)
*G06F 19/00* (2006.01)

(52) U.S. Cl. .................. 438/622; 438/641; 438/694; 257/536; 700/121

(58) Field of Classification Search ............... 700/121; 438/694, 696, 637, 622, 108, 197, 217, 343, 438/641, 695; 257/E29.005, 622, 623, 291, 257/339, 355, 536
See application file for complete search history.

(56) References Cited

U.S. PATENT DOCUMENTS

| | | | | |
|---|---|---|---|---|
| 3,796,929 | A | * 3/1974 | Nicholas et al. | 257/536 |
| 4,310,390 | A | 1/1982 | Bradley et al. | |
| 4,357,387 | A | 11/1982 | George et al. | 442/71 |

(Continued)

FOREIGN PATENT DOCUMENTS

DE    94 21 671    7/1996

(Continued)

OTHER PUBLICATIONS

Kim, Hee Jee, "Plasma-Sprayed Alumina-Yttria Ceramic Coatings for Cavitation-Erosion Protection," Sep. 1989, pp. 139-146.

(Continued)

*Primary Examiner*—Crystal J Barnes-Bullock
(74) *Attorney, Agent, or Firm*—Oblon, Spivak, McClelland, Maier & Neustadt, P.C.

(57) ABSTRACT

Two or more coatings applied to processing elements of a plasma processing system are treated with protective barriers or coatings. A method is described for adjoining two or more coatings on the processing element. Having applied a first protective barrier, a portion of the first protective barrier is treated. A second protective barrier is then applied over at least a portion of a region to which the first protective barrier was applied.

25 Claims, 6 Drawing Sheets

U.S. PATENT DOCUMENTS

| | | | |
|---|---|---|---|
| 4,469,619 A | 9/1984 | Ohno et al. | |
| 4,593,007 A | 6/1986 | Novinski | |
| 4,612,077 A | 9/1986 | Tracy et al. | |
| 4,649,858 A | 3/1987 | Sakai et al. | |
| 4,842,683 A | 6/1989 | Cheng et al. | |
| 4,877,757 A | 10/1989 | York et al. | |
| 5,000,113 A | 3/1991 | Wang et al. | |
| 5,074,456 A | 12/1991 | Degner et al. | |
| 5,126,102 A | 6/1992 | Takahashi et al. | |
| 5,180,467 A | 1/1993 | Cook et al. | |
| 5,200,634 A * | 4/1993 | Tsukada et al. | 257/291 |
| 5,334,462 A | 8/1994 | Vine et al. | |
| 5,362,335 A | 11/1994 | Rungta | |
| 5,366,585 A | 11/1994 | Robertson et al. | |
| 5,367,838 A | 11/1994 | Visaisouk et al. | |
| 5,423,936 A | 6/1995 | Tomita et al. | |
| 5,426,310 A | 6/1995 | Tamada et al. | |
| 5,484,752 A | 1/1996 | Waku et al. | |
| 5,489,449 A | 2/1996 | Umeya et al. | |
| 5,494,713 A | 2/1996 | Ootuki | |
| 5,521,790 A | 5/1996 | Ruckel et al. | 361/234 |
| 5,534,356 A | 7/1996 | Mahulikar et al. | |
| 5,551,190 A | 9/1996 | Yamagishi et al. | |
| 5,556,501 A | 9/1996 | Collins et al. | |
| 5,614,055 A | 3/1997 | Fairbairn et al. | |
| 5,637,237 A | 6/1997 | Oehrlein et al. | |
| 5,641,375 A | 6/1997 | Nitescu et al. | |
| 5,651,723 A | 7/1997 | Bjornard et al. | |
| 5,680,013 A | 10/1997 | Dornfest et al. | |
| 5,725,960 A | 3/1998 | Konishi et al. | |
| 5,759,360 A | 6/1998 | Ngan et al. | |
| 5,798,016 A | 8/1998 | Oehrlein et al. | |
| 5,820,723 A | 10/1998 | Benjamin et al. | |
| 5,834,070 A | 11/1998 | Movchan et al. | |
| 5,851,343 A | 12/1998 | Hsu et al. | |
| 5,868,848 A | 2/1999 | Tsukamoto | |
| 5,879,575 A | 3/1999 | Tepman et al. | |
| 5,882,411 A | 3/1999 | Zhao et al. | |
| 5,885,356 A | 3/1999 | Zhao et al. | |
| 5,885,402 A | 3/1999 | Esquibel | 156/345.24 |
| 5,891,253 A | 4/1999 | Wong et al. | |
| 5,891,350 A | 4/1999 | Shan et al. | |
| 5,892,278 A | 4/1999 | Horita | 257/706 |
| 5,894,887 A | 4/1999 | Kelsey et al. | |
| 5,895,586 A | 4/1999 | Kaji et al. | |
| 5,900,064 A | 5/1999 | Kholodenko | |
| 5,902,763 A | 5/1999 | Waku et al. | |
| 5,904,778 A | 5/1999 | Lu et al. | |
| 5,911,852 A | 6/1999 | Katayama et al. | |
| 5,919,332 A | 7/1999 | Koshiishi et al. | |
| 5,925,228 A | 7/1999 | Panitz | 204/484 |
| 5,944,902 A | 8/1999 | Redeker et al. | |
| 5,948,521 A | 9/1999 | Dlugosch et al. | |
| 5,952,054 A | 9/1999 | Sato et al. | |
| 5,952,060 A | 9/1999 | Ravi | |
| 5,955,182 A | 9/1999 | Yasuda et al. | |
| 5,968,377 A | 10/1999 | Yuasa et al. | |
| 5,985,102 A | 11/1999 | Leiphart | |
| 5,994,662 A | 11/1999 | Murugesh | |
| 6,068,729 A | 5/2000 | Shrotriya | 156/345.26 |
| 6,073,449 A | 6/2000 | Watanabe et al. | 62/3.2 |
| 6,079,356 A | 6/2000 | Umotoy et al. | |
| 6,096,161 A | 8/2000 | Kim et al. | |
| 6,106,625 A | 8/2000 | Koai et al. | |
| 6,108,189 A | 8/2000 | Weldon et al. | |
| 6,110,287 A | 8/2000 | Arai et al. | |
| 6,120,640 A | 9/2000 | Shih et al. | |
| 6,120,955 A | 9/2000 | Tokutake et al. | |
| 6,123,791 A | 9/2000 | Han et al. | |
| 6,123,804 A | 9/2000 | Babassi et al. | |
| 6,129,808 A | 10/2000 | Wicker et al. | |
| 6,139,983 A | 10/2000 | Ohashi et al. | |
| 6,143,646 A | 11/2000 | Wetzel | |
| 6,170,429 B1 | 1/2001 | Schoepp et al. | |
| 6,176,969 B1 | 1/2001 | Park et al. | |
| 6,182,603 B1 | 2/2001 | Shang et al. | |
| 6,188,109 B1 * | 2/2001 | Takahashi | 257/355 |
| 6,210,486 B1 | 4/2001 | Mizukami et al. | |
| 6,221,202 B1 | 4/2001 | Walko, II | |
| 6,246,479 B1 | 6/2001 | Jung et al. | |
| 6,264,788 B1 | 7/2001 | Tomoyasu et al. | |
| 6,265,757 B1 | 7/2001 | Brady | |
| 6,266,133 B1 | 7/2001 | Miyajima et al. | |
| 6,296,716 B1 | 10/2001 | Haerle et al. | |
| 6,296,740 B1 | 10/2001 | Xie et al. | |
| 6,312,981 B1 * | 11/2001 | Akamatsu et al. | 438/217 |
| 6,335,293 B1 | 1/2002 | Luo et al. | |
| 6,364,949 B1 | 4/2002 | Or et al. | |
| 6,368,987 B1 | 4/2002 | Kopacz et al. | |
| 6,373,573 B1 | 4/2002 | Jung et al. | |
| 6,383,333 B1 | 5/2002 | Haino et al. | |
| 6,383,964 B1 | 5/2002 | Nakahara et al. | |
| 6,387,817 B1 | 5/2002 | Buckfeller | |
| 6,394,026 B1 | 5/2002 | Wicker et al. | |
| 6,413,578 B1 | 7/2002 | Stowell et al. | |
| 6,444,083 B1 | 9/2002 | Steger et al. | |
| 6,514,377 B1 | 2/2003 | Morimoto | |
| 6,519,037 B2 | 2/2003 | Jung et al. | |
| 6,527,911 B1 | 3/2003 | Yen et al. | |
| 6,533,910 B2 | 3/2003 | O'Donnell et al. | |
| 6,537,429 B2 | 3/2003 | O'Donnell et al. | |
| 6,544,380 B2 | 4/2003 | Tomoyasu et al. | |
| 6,554,906 B1 | 4/2003 | Kuibira et al. | |
| 6,562,186 B1 | 5/2003 | Saito et al. | 156/345.24 |
| 6,570,654 B2 | 5/2003 | Jung et al. | |
| 6,583,064 B2 | 6/2003 | Wicker et al. | |
| 6,590,660 B2 | 7/2003 | Jung et al. | |
| 6,613,204 B2 | 9/2003 | Xie et al. | |
| 6,613,442 B2 | 9/2003 | O'Donnell et al. | |
| 6,632,549 B1 | 10/2003 | Ohashi et al. | |
| 6,641,697 B2 | 11/2003 | Han et al. | |
| 6,663,714 B2 | 12/2003 | Mizuno et al. | |
| 6,670,255 B2 * | 12/2003 | Adkisson et al. | 438/343 |
| 6,695,929 B2 | 2/2004 | Kanekiyo et al. | |
| 6,726,801 B2 | 4/2004 | Ahn | |
| 6,733,620 B1 | 5/2004 | Sugiyama et al. | |
| 6,738,862 B1 | 5/2004 | Ross et al. | |
| 6,771,483 B2 | 8/2004 | Harada et al. | |
| 6,776,873 B1 | 8/2004 | Sun et al. | |
| 6,783,863 B2 | 8/2004 | Harada et al. | |
| 6,783,875 B2 | 8/2004 | Yamada et al. | |
| 6,798,519 B2 | 9/2004 | Nishimoto et al. | |
| 6,805,952 B2 | 10/2004 | Chang et al. | |
| 6,806,949 B2 | 10/2004 | Ludviksson et al. | |
| 6,811,651 B2 | 11/2004 | Long | |
| 6,830,622 B2 | 12/2004 | O'Donnell et al. | |
| 6,833,279 B2 | 12/2004 | Choi | |
| 6,837,966 B2 | 1/2005 | Nishimoto et al. | |
| 6,849,486 B2 * | 2/2005 | Yamada et al. | 438/197 |
| 6,852,433 B2 | 2/2005 | Maeda | |
| 6,863,594 B2 | 3/2005 | Preising | |
| 6,875,477 B2 | 4/2005 | Trickett et al. | |
| 6,884,516 B2 | 4/2005 | Harada et al. | |
| 6,894,769 B2 | 5/2005 | Ludviksson et al. | |
| 6,896,785 B2 | 5/2005 | Shatrov et al. | |
| 7,037,754 B2 * | 5/2006 | Ueda | 438/108 |
| 7,122,861 B2 * | 10/2006 | Mori | 257/339 |
| 7,147,749 B2 | 12/2006 | Nishimoto et al. | |
| 7,163,585 B2 | 1/2007 | Nishimoto et al. | |
| 7,300,537 B2 | 11/2007 | O'Donnell et al. | |
| 7,311,797 B2 | 12/2007 | O'Donnell et al. | |
| 7,332,371 B2 * | 2/2008 | Hashimoto | 438/108 |
| 2001/0003271 A1 | 6/2001 | Otsuki | |
| 2001/0050144 A1 | 12/2001 | Nishikawa et al. | |

| | | | | | | |
|---|---|---|---|---|---|---|
| 2002/0076508 A1 | 6/2002 | Chiang et al. | | JP | 06-287739 | 10/1994 |
| 2002/0086118 A1 | 7/2002 | Chang et al. | | JP | 07-058013 A | 3/1995 |
| 2002/0086501 A1 | 7/2002 | O'Donnell et al. | | JP | 07-126827 | 5/1995 |
| 2002/0086545 A1 | 7/2002 | O'Donnell et al. | | JP | 07-176524 | 7/1995 |
| 2002/0086553 A1 | 7/2002 | O'Donnell et al. | | JP | 07-226378 | 8/1995 |
| 2002/0090464 A1 | 7/2002 | Jiang et al. | | JP | 07-245295 | 9/1995 |
| 2002/0142611 A1 | 10/2002 | O'Donnell et al. | | JP | 08-037180 | 2/1996 |
| 2002/0177001 A1 | 11/2002 | Harada et al. ............... 428/469 | | JP | 08-041309 | 2/1996 |
| 2003/0010446 A1 | 1/2003 | Kajiyama et al. | | JP | 08-081777 | 3/1996 |
| 2003/0029563 A1 | 2/2003 | Kaushal et al. | | JP | 08-268751 | 10/1996 |
| 2003/0084848 A1 | 5/2003 | Long | | JP | 08-339895 | 12/1996 |
| 2003/0113479 A1 | 6/2003 | Fakuda et al. ............... 427/569 | | JP | 09-069554 | 3/1997 |
| 2003/0150419 A1 | 8/2003 | Daragheh et al. | | JP | 09-228070 | 9/1997 |
| 2003/0200929 A1 | 10/2003 | Otsuki | | JP | 09-272987 | 10/1997 |
| 2004/0026372 A1 | 2/2004 | Takenaka et al. | | JP | 10-004083 | 1/1998 |
| 2004/0035364 A1 | 2/2004 | Tomoyoshi et al. | | JP | 10-045461 | 2/1998 |
| 2004/0050495 A1 | 3/2004 | Sumiya et al. | | JP | 10-045467 | 2/1998 |
| 2004/0060516 A1 | 4/2004 | Nishimoto et al. | | JP | 10-130884 | 5/1998 |
| 2004/0060656 A1 | 4/2004 | Saigusa et al. | | JP | 10-214819 | 8/1998 |
| 2004/0060657 A1 | 4/2004 | Saigusa et al. | | JP | 10-226869 | 8/1998 |
| 2004/0060658 A1 | 4/2004 | Nishimoto et al. | | JP | 10-251871 | 9/1998 |
| 2004/0060661 A1 | 4/2004 | Nishimoto et al. | | JP | 11-001757 | 1/1999 |
| 2004/0060779 A1 | 4/2004 | Kreger | | JP | 11-080925 | 3/1999 |
| 2004/0061447 A1 | 4/2004 | Saigusa et al. | | JP | 11-207161 | 8/1999 |
| 2004/0063333 A1 | 4/2004 | Saigusa et al. | | JP | 11-233292 | 8/1999 |
| 2004/0072426 A1 | 4/2004 | Jung | | JP | 11-310451 | 11/1999 |
| 2004/0081746 A1 | 4/2004 | Imafuku | | JP | 11-312646 | 11/1999 |
| 2004/0083970 A1 | 5/2004 | Imafuku et al. | | JP | 2000-119840 A | 4/2000 |
| 2004/0125359 A1 | 7/2004 | Ludviksson et al. | | JP | 2000-124197 | 4/2000 |
| 2004/0168640 A1 | 9/2004 | Muto et al. | | JP | 2000-303180 | 10/2000 |
| 2004/0173155 A1 | 9/2004 | Nishimoto et al. | | JP | 2001-031484 | 2/2001 |
| 2004/0216667 A1 | 11/2004 | Mitsuhashi et al. | | JP | 2001-152307 | 6/2001 |
| 2005/0103268 A1 | 5/2005 | Nishimoto et al. | | JP | 2001-164354 | 6/2001 |
| 2005/0103275 A1 | 5/2005 | Sasaki et al. | | JP | 2001-226773 | 8/2001 |
| 2005/0150866 A1 | 7/2005 | O'Donnell ................... 216/67 | | JP | 2002094182 A * | 3/2002 |
| 2006/0134919 A1 | 6/2006 | Hamelin et al. | | JP | 2002-151473 | 5/2002 |
| | | | | KR | 1991-002451 | 6/1988 |
| | | | | KR | 1999-0008937 | 9/1994 |
| | | | | KR | 1998-063542 | 10/1998 |
| | | | | KR | 1999-008142 | 1/1999 |
| | | | | KR | 1999-13565 | 2/1999 |
| | | | | KR | 2002-0027373 | 4/2002 |
| | | | | KR | 10/2004-0007601 | 1/2004 |
| | | | | WO | 99/50886 | 10/1999 |
| | | | | WO | 01/42526 | 6/2001 |
| | | | | WO | 02/39495 | 5/2002 |
| | | | | WO | 02/48421 | 6/2002 |
| | | | | WO | 2004/030011 | 4/2004 |
| | | | | WO | 2004/030012 | 4/2004 |
| | | | | WO | 2004/030013 | 4/2004 |
| | | | | WO | 2004/030014 | 4/2004 |
| | | | | WO | 2004/030015 | 4/2004 |
| | | | | WO | 2004/030020 | 4/2004 |
| | | | | WO | 2004/030426 | 4/2004 |
| | | | | WO | 2004/095530 | 11/2004 |
| | | | | WO | 2004/095532 | 11/2004 |

FOREIGN PATENT DOCUMENTS

| | | |
|---|---|---|
| EP | 0326318 | 8/1989 |
| EP | 0 508 731 | 10/1992 |
| EP | 0 573 057 | 12/1993 |
| EP | 0 814 495 | 6/1997 |
| EP | 0 799 904 | 10/1997 |
| EP | 0 841 838 | 5/1998 |
| EP | 1 069 603 | 1/2001 |
| EP | 1 081 749 | 7/2001 |
| EP | 1 156 130 | 11/2001 |
| GB | 2 252 567 | 8/1992 |
| JP | 59-186325 | 10/1984 |
| JP | 61-207566 | 9/1986 |
| JP | 62-067161 | 3/1987 |
| JP | 63-000450 | 1/1988 |
| JP | 64-039728 | 2/1989 |
| JP | 1-120328 | 8/1989 |
| JP | 1-312087 | 12/1989 |
| JP | 02-267967 | 11/1990 |
| JP | 03-115535 | 5/1991 |
| JP | 4-238882 | 8/1992 |
| JP | 05-070922 | 3/1993 |
| JP | 05-117064 | 5/1993 |
| JP | 05-121360 | 5/1993 |
| JP | 05-198532 | 8/1993 |
| JP | 05-238855 | 9/1993 |
| JP | 05-238859 | 9/1993 |
| JP | 06-011346 | 2/1994 |
| JP | 06-057396 | 3/1994 |
| JP | 06-136505 | 5/1994 |
| JP | 06-142822 | 5/1994 |
| JP | 06-196548 | 7/1994 |
| JP | 06-256926 | 9/1994 |

OTHER PUBLICATIONS

Production drawing for Deposition Shield, Upper believed to be sold in the U.S. on Apr. 12, 2000.

Production drawing for Deposition Shield believed to be sold in the U.S. prior to Sep. 30, 2001.

Production drawing for Upper Electrode believed to be sold in the U.S. prior to Sep. 30, 2001.

JIS Using Series, "Spraying Techniques Manual.", p. 95 (Oct. 30, 1998, Japanese Standard Association), with English Translation.

Yousha Gitjutsu Handbook, 1$^{st}$ Edition, Japan Thermal Spraying Society, Techno Consultants, Inc., pp. 3, 316-317 (1998) (with partial English translation).

* cited by examiner

METHOD FOR ADJOINING ADJACENT COATINGS ON A PROCESSING ELEMENT

CROSS-REFERENCE TO RELATED APPLICATIONS

This application claims priority to and is related to U.S. Provisional Application Ser. No. 60/458,407, filed on Mar. 31, 2003, which is related to co-pending U.S. patent application Ser. No. 10/259,757, filed Sep. 30, 2002; co-pending U.S. patent application Ser. No. 10/259,858, filed Sep. 30, 2002; co-pending U.S. patent application Ser. No. 10/259,382, filed Sep. 30, 2002; co-pending U.S. patent application Ser. No. 10/259,380, filed Sep. 30, 2002; co-pending U.S. patent application Ser. No. 10/259,353, filed Sep. 30, 2002; co-pending U.S. patent application Ser. No. 10/259,352, filed Sep. 30, 2002; and co-pending U.S. patent application Ser. No. 10/259,306, filed Sep. 30, 2002. The entire contents of all of those applications are herein incorporated by reference in their entirety.

FIELD OF THE INVENTION

The present invention relates to a method of forming a protective barrier on a processing element, and more particularly to a method of adjoining adjacent protective barriers on a processing element.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

In order to minimize the damage sustained by exposure to the processing plasma, components of the plasma processing system, known to sustain exposure to the processing plasma, are coated with a protective barrier. For example, components fabricated from aluminum can be anodized to produce a surface layer of aluminum oxide, which is more resistant to the plasma. In another example, a consumable or replaceable component, such as one fabricated from silicon, quartz, alumina, carbon, or silicon carbide, can be inserted within the processing chamber to protect the surfaces of more valuable components that would impose greater costs during frequent replacement. Furthermore, it is desirable to select surface materials that minimize the introduction of unwanted contaminants, impurities, etc. to the processing plasma and possibly to the devices formed on the substrate.

In both cases, the inevitable failure of the protective coating, either due to the integrity of the protective barrier or the integrity of the fabrication of the protective barrier, and the consumable nature of the replaceable components demands frequent maintenance of the plasma processing system. This frequent maintenance can produce costs associated with plasma processing down-time and new plasma processing chamber components, which can be excessive.

SUMMARY OF THE INVENTION

A method of forming a protective barrier on a processing element is described.

A method for adjoining two or more protective barriers on a processing element comprising: defining a transition region on the processing element, wherein the transition region comprises an overlap of a first protective barrier and a second protective barrier; applying the first protective barrier to a first region of the processing element, the first region comprising the transition region; treating a second region of the processing element in order to improve adhesion of the second protective barrier, the second region comprising the transition region; and applying the second protective barrier to the second region.

A processing element for a processing system comprising a first protective barrier coupled to a first region on the processing element; and a second protective barrier coupled to a second region on the processing element, wherein the first region and the second region overlap to form a transition region.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

Figure 1:
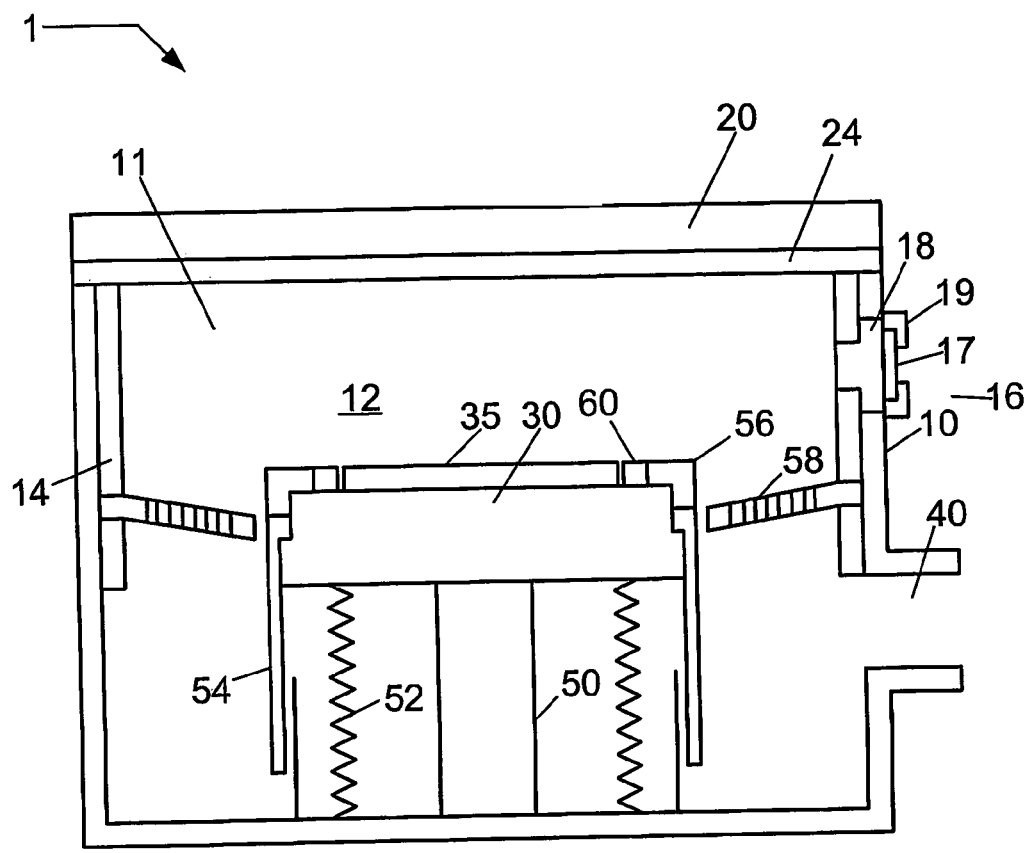
FIG. 1 illustrates a schematic block diagram of a plasma processing system according to an embodiment of the present invention.

A plasma processing system 1, such as one capable of plasma etching, is depicted in FIG. 1 comprising a processing chamber 10, an upper assembly 20, an upper wall 24, a substrate holder 30 for supporting a substrate 35, and a pumping duct 40 coupled to a vacuum pump (not shown) for providing a reduced pressure atmosphere 11 in processing chamber 10. Processing chamber 10 can, for example, facilitate the formation of a processing plasma in a process space 12 adjacent substrate 35. The plasma processing system 1 can be configured to process various substrates (i.e. 200 mm substrates, 300 mm substrates, or larger).

In the illustrated embodiment, upper assembly 20 can comprise at least one of a cover, a gas injection assembly, and an upper electrode impedance match network. For example, the upper wall 24 can, for example, be configured to comprise an electrode having an electrode plate that is coupled to a radio frequency (RF) source, and therefore facilitate an upper electrode for the plasma processing system 1. In another alternate embodiment, the upper assembly 20 comprises a cover and an upper wall 24, wherein the upper wall 24 is maintained at an electrical potential equivalent to that of the processing chamber 10. For example, the processing chamber 10, the upper assembly 20, and the upper wall 24 can be electrically connected to ground potential, and facilitate a grounded wall for the plasma processing system 1.

Processing chamber 10 can, for example, further comprise a deposition shield 14 for protecting the plasma processing chamber 10 from the processing plasma in the process space 12, and an optical viewport 16. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the processing chamber 10. Optical window deposition shield 18 can extend through an opening 70 within deposition shield 14. Optical viewport 16 can, for example, permit monitoring of optical emission from the processing plasma in process space 12.

Substrate holder 30 can, for example, further comprise a vertical translational device 50 surrounded by a bellows 52 coupled to the substrate holder 30 and the processing chamber 10, and configured to seal the vertical translational device 50 from the reduced pressure atmosphere 11 in processing chamber 10. Additionally, a bellows shield 54 can, for example, be coupled to the substrate holder 30 and configured to protect the bellows 52 from a processing plasma. Substrate holder 10 can further be coupled to a focus ring 60, and, optionally, a shield ring 56. Furthermore, a baffle plate 58 can, for example, extend about a periphery of the substrate holder 30.

Substrate 35 can be, for example, transferred into and out of processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from the substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system to substrate holder 30. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermo-electric heaters/coolers can be included.

In the illustrated embodiment, shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz, for example, 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, transformer coupled plasma (TCP) source, any combination thereof, and with and without DC magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Referring still to FIG. 1, plasma processing device 1 comprises one or more processing elements, each of which can be exposed to the processing plasma in process space 12, and are, therefore, subject to potential erosion during processing. For example, the one or more processing elements can comprise an electrode plate, a deposition shield, a chamber liner, a bellows shield, a baffle plate, an optical window deposition shield, a shield ring, a focus ring, etc. In order to mitigate erosion of the exposed processing elements by the processing plasma and any subsequent contamination of the substrate, the processing elements are coated with a protective barrier.

Figure 2A:
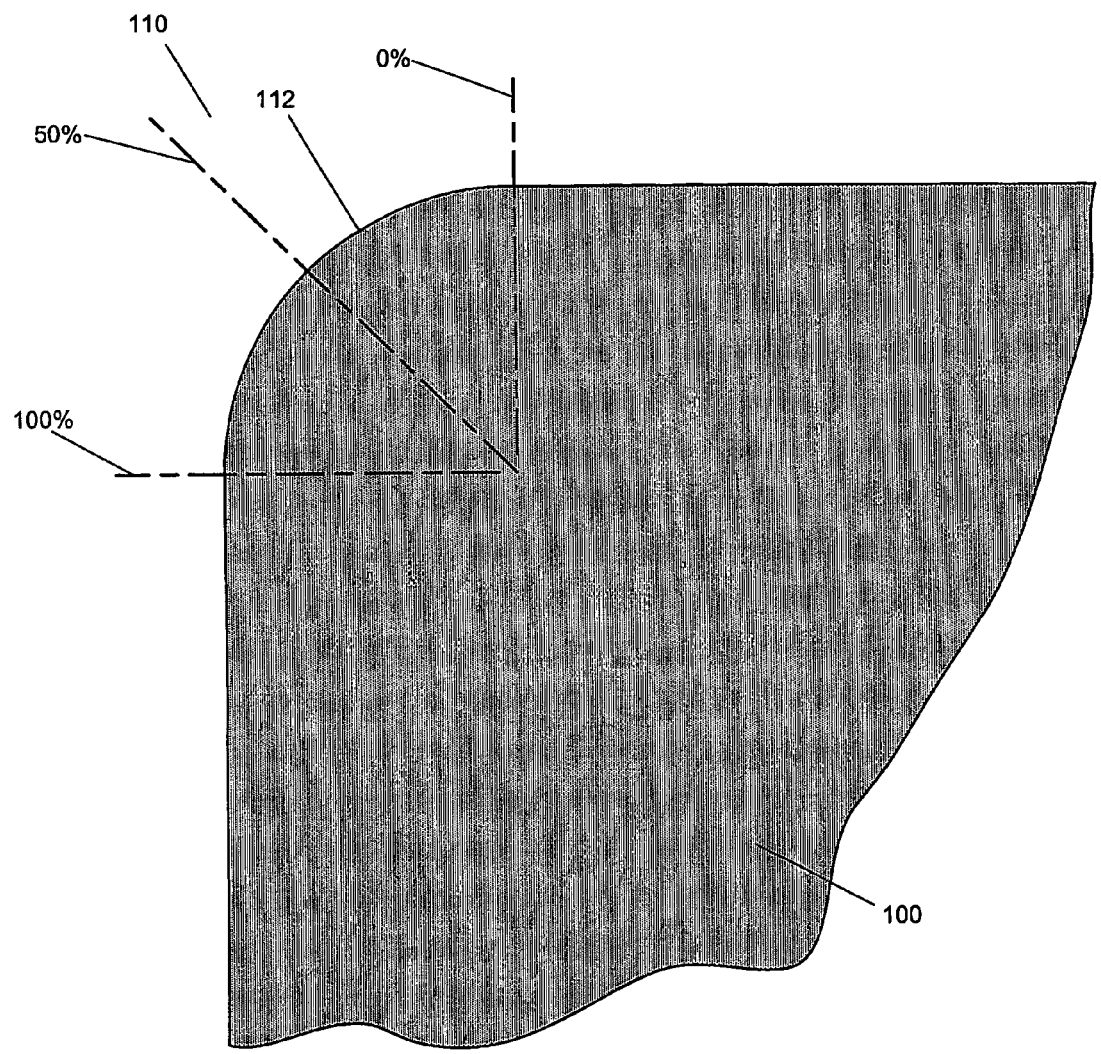
FIG. 2A presents an expanded cross-sectional view of a portion of a processing element in a plasma processing system as shown in FIG. 1.

In an embodiment, as depicted in FIG. 2A, a processing element 100 comprises a transition region 110, wherein a first protective barrier 120 is adjoined with a second protective barrier 130. For example, the transition region can define the extent of overlap between the first protective barrier 120 and the second protective barrier 130. As shown in FIG. 2A, the transition region 110 can comprise an edge, wherein the edge can be characterized by at least one edge radius 112. Moreover, in this example, the transition region 110 can extend from 0 to 100% of the radial arc of the edge.

Either protective barrier 120, 130 can, for example, comprise one of a surface anodization, a coating formed using plasma electrolytic oxidation, or a spray coating such as a thermal spray coating. In an embodiment, either protective barrier 120, 130 can comprise at least one of $Al_2O_3$ and $Y_2O_3$. In another embodiment, either protective barrier 120, 130 comprises at least one of a III-column element (column III of periodic table) and a Lanthanon element. In another embodiment, the III column element comprises at least one of Yttrium, Scandium, and Lanthanum. In another embodiment, the Lanthanon element comprises at least one of Cerium, Dysprosium, and Europium. In another embodiment, the compound forming protective layer comprises at least one of Yttria ($Y_2O_3$), $Sc_2O_3$, $Sc_2F_3$, $YF_3$, $La_2O_3$, $CeO_2$, $Eu_2O_3$, and Dy$_2$O$_3$. In another embodiment, either protective barrier 120, 130 can comprise Keronite (surface coating treatment commercially available from Keronite Limited, Advanced Surface Technology, PO Box 700, Granta Park, Great Abington, Cambridge CB1 6ZY, UK). In another embodiment, either protective barrier 120, 130 can comprise at least one of silicon, silicon carbide, alumina, Teflon, Vespel, or Kapton. For example, the first protective barrier 120 can comprise surface anodization, and the second protective barrier 130 can comprise a spray coating.

Figure 2B:
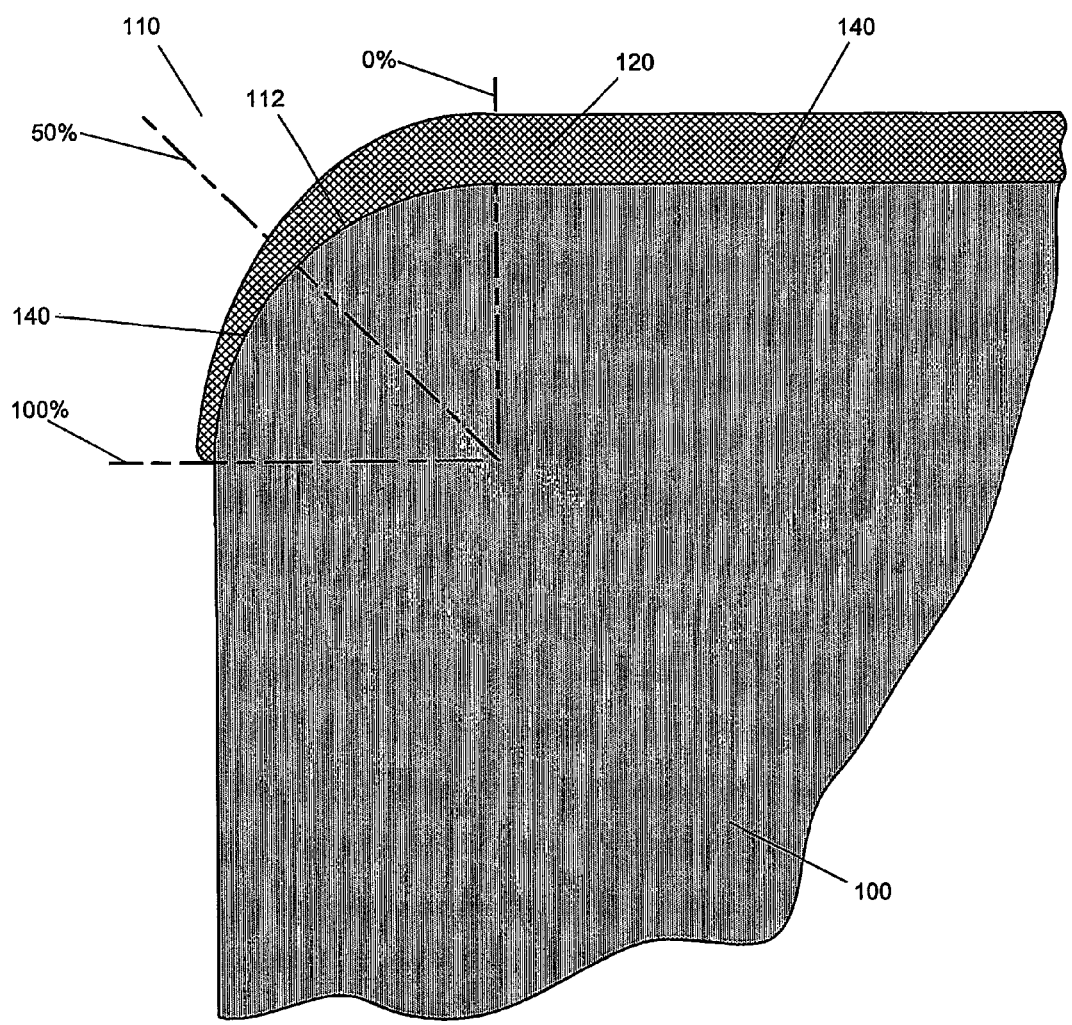
FIG. 2B presents another expanded cross-sectional view of a portion of a processing element in a plasma processing system as shown in FIG. 1.

As illustrated in FIG. 2A, the transition region 110 can comprise an edge of the processing element 100, and the edge can be machined to comprise an edge radius 112. The edge radius 112 can exceed 0.5 mm, and, for example, it can range from 0.5 mm to 2 mm. Alternately, the edge radius 112 can exceed 2 mm. Alternately, the edge radius can approach an infinite radius (i.e. a flat surface). As illustrated in FIG. 2B, the first protective barrier 120 can be applied to a first region 140 of the processing element in order to extend over at least a portion of the transition region 110. For example, when the transition region 110 comprises an edge, the extension of the first protective barrier 120 over the transition region 110 should comprise at least 50% of the edge radial arc, and desirably, the extension ranges from 90 to 110% of the edge radial arc. The application of the first protective barrier can include masking regions, or surfaces, of the processing element in order to prevent the application of the first protective barrier 120 to these regions/surfaces. Moreover, the application of the first protective barrier 120 can further include subsequent re-machining of regions, or surfaces, of the processing element 100 where the application of the first protective coating 120 is undesirable.

Figure 2C:
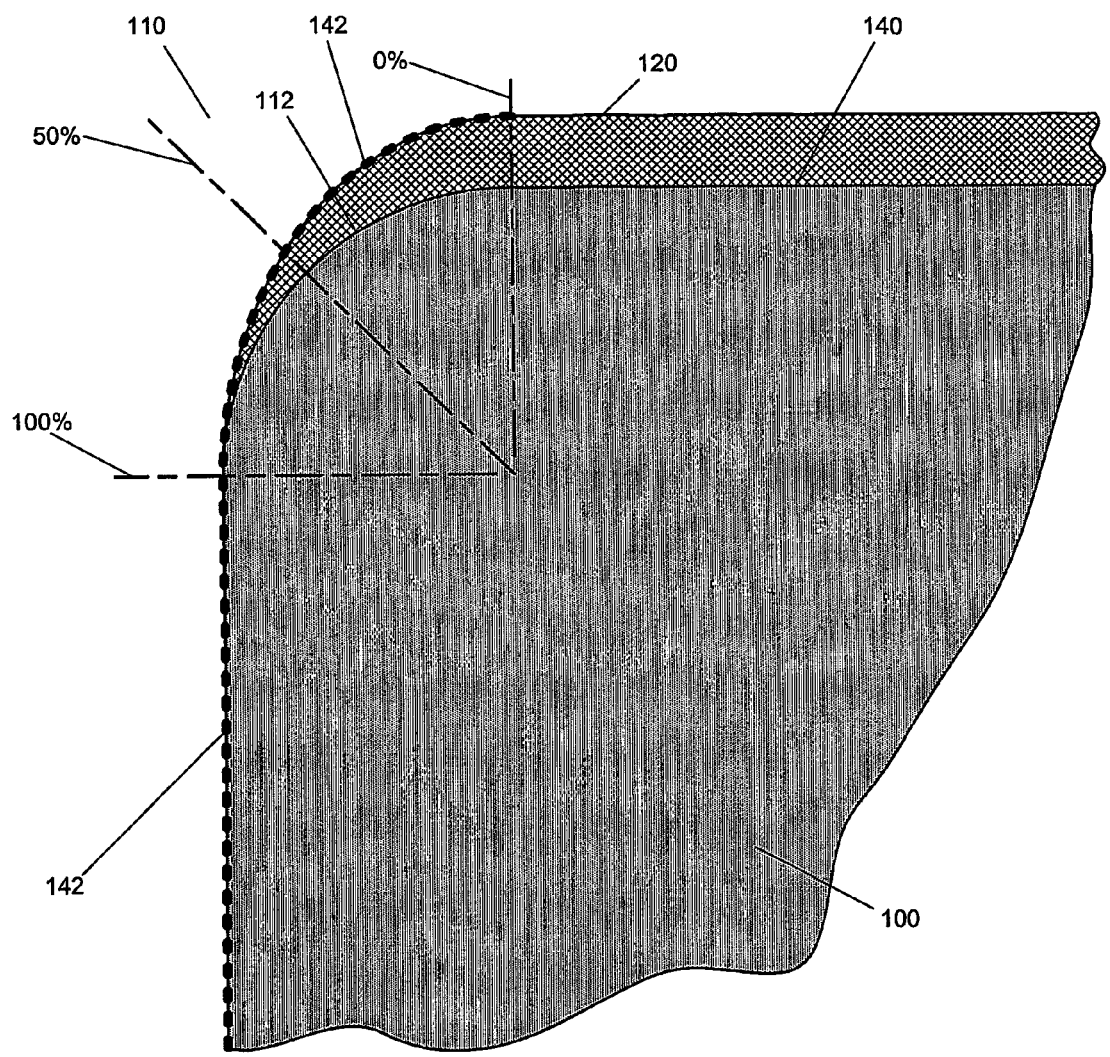
FIG. 2C presents another expanded cross-sectional view of a portion of a processing element in a plasma processing system as shown in FIG. 1.

Following the application of the first protective barrier 120, a second region 142 of the processing element 100 can be altered in order to roughen the surface layer of the second region 142. The altering of the second region 142 can, for example, comprise grit blasting. As illustrated in FIG. 2C, the second region 142 (highlighted by the thick dashed line) comprises a portion of the first region 140 and extends over at least a portion of the transition region 110 of the processing element. For example, when the transition region 110 comprises an edge, the extension of the second region 142 should comprise at least 50% of the edge radial arc as shown in FIG. 2C.

Figure 2D:
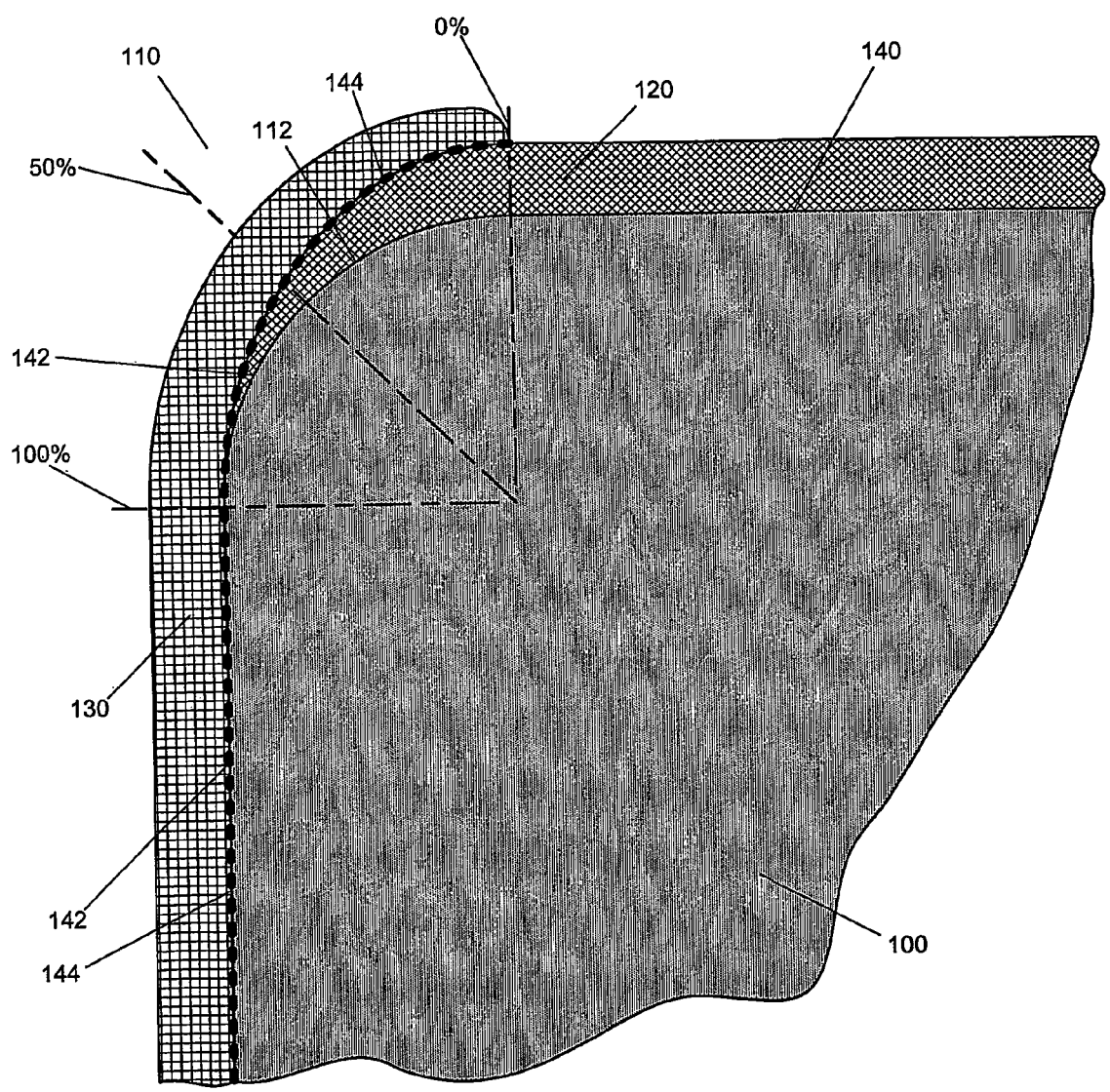
FIG. 2D presents another expanded cross-sectional view of a portion of a processing element in a plasma processing system as shown in FIG. 1.

Following the altering of the second region 142, the second protective barrier 130 can be applied to a third region 144 of the processing element in order to extend over the transition region 110 and partially cover the first protective barrier 120. For example, when the transition region 110 comprises an edge, the extension of the second protective barrier 130 over the transition region 110 should comprise at least 50% of the edge radial arc, and desirably, the extension ranges from 90 to 110%, as illustrated in FIG. 2D. The application of the second protective barrier 130 can include masking regions, or surfaces, of the processing element in order to prevent the application of the second protective barrier 130 to these regions/surfaces.

Figure 3:
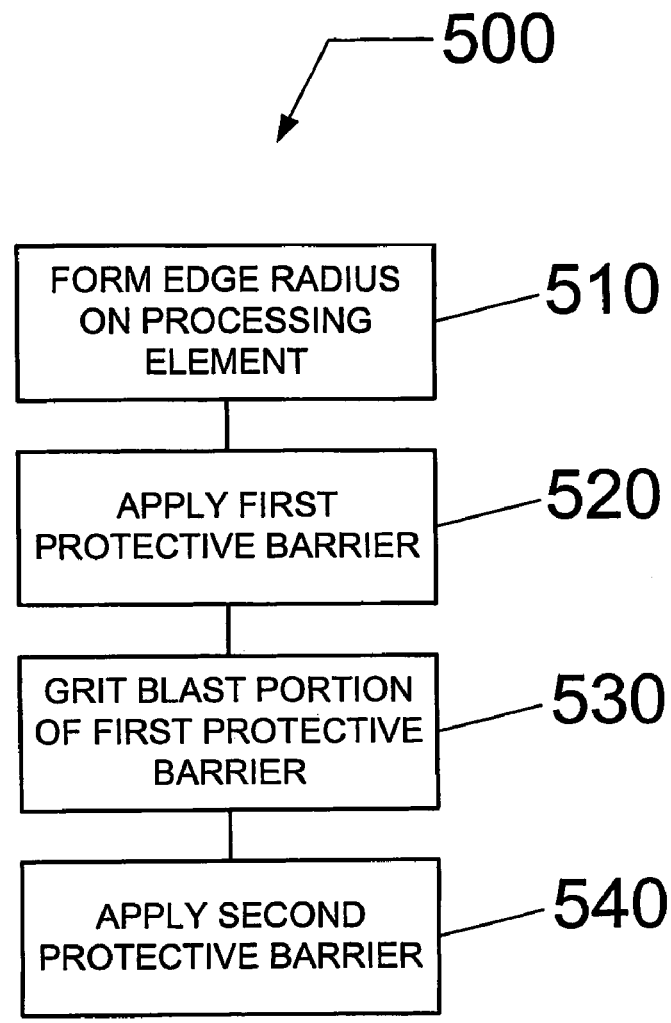
FIG. 3 presents a method of forming a protective barrier on a processing element in a plasma processing system according to an embodiment of the present invention.

FIG. 3 presents a method of adjoining adjacent coatings following the description set forth above. The method is presented in flow chart 500 beginning with step 510, wherein a transition region is defined on at least one portion of a processing element. For example, the transition region can comprise at least a portion of an edge having an edge radius on the processing element. The processing element can, for example, be fabricated using at least one of machining, polishing, and grinding. For example, the processing element described above can be machined according to specifications set forth on a mechanical drawing, using conventional techniques including a mill, etc. The techniques for machining a component using, for example, a mill, are well known to those skilled in the art of machining such materials. The processing element can, for example, comprise aluminum.

In step 520, a first protective barrier is formed on a first region of the processing element, wherein the first region includes the transition region of the processing element. The first protective barrier can, for example, comprise a surface anodization layer. At least one of masking or re-machining can be performed to ensure conformance of the first protective barrier to the first region.

In step 530, a second region of the processing element also occupying the transition region can be altered to promote improved adhesion of a second protective barrier, particularly over the transition region. The altering of the second region can, for example, comprise grit blasting.

In step 540, a second protective barrier is formed on the second region of the processing element. The second protective barrier can, for example, comprise a surface spray coating. At least one of masking or re-machining can be performed to ensure conformance of the second protective barrier to the second region.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for adjoining at least two protective barriers on a processing element comprising:
    defining a transition region on said processing element, wherein said transition region comprises an overlap of a first protective barrier and a second protective barrier;
    applying said first protective barrier to a first region of said processing element, said first region comprising a region where the second protective barrier is not applied and including said transition region;
    treating a second region of said processing element in order to improve adhesion of said second protective barrier, said second region comprising a region where the first protective barrier is not applied and including said transition region; and
    applying said second protective barrier to said second region such that the second protective barrier overlaps the first protective barrier only in the transition region of the first and second regions.

2. The method as recited in claim 1, wherein said transition region comprises at least a portion of an edge.

3. The method as recited in claim 2, wherein said edge is characterized by at least one edge radius.

4. The method as recited in claim 3 further comprising forming said edge, wherein said edge comprises one edge radius, and said edge radius ranges from 0.5 mm to 5 mm.

5. The method as recited in claim 4, wherein said edge radius ranges from 0.5 mm to 2 mm.

6. The method as recited in claim 1, wherein said first protective layer and said second protective layer comprise at least one of a surface anodization, a coating formed using plasma electrolytic oxidation, and a spray coating.

7. The method as recited in claim 1, wherein said first protective layer and said second protective layer comprise at least one of alumina, carbon, silicon carbide, silicon, quartz, Teflon, Vespel, and Kapton.

8. The method as recited in claim 1, wherein said first protective barrier and said second protective barrier comprise at least one of a III-column element and a Lanthanon element.

9. The method as recited in claim 1, wherein said first protective barrier and said second protective barrier comprise at least one of Yttria ($Y_2O_3$), $Sc_2O_3$, $Sc_2F_3$, $YF_3$, $La_2O_3$, $CeO_2$, $Eu_2O_3$, and $Dy_2O_3$.

10. The method as recited in claim 1, wherein said first protective barrier comprises a surface anodization, and said second protective barrier comprises a spray coating.

11. The method as recited in claim 1, wherein said treating comprises grit blasting.

12. A processing element for a processing system comprising:
   a first protective barrier coupled to a first region on said processing element the first region including a transition region; and
   a second protective barrier coupled to a second region on said processing element the second region including said transition region,
   wherein said first region and said second region overlap only in said transition region such that the first and second protective barriers overlap only in the transition region of the first and second regions.

13. The processing element as recited in claim 12, wherein said second region is treated to improve the adhesion of said second protective barrier.

14. The processing element as recited in claim 13, wherein said treating comprises grit blasting.

15. The processing element as recited in claim 12, wherein said transition region comprises at least a portion of an edge.

16. The processing element as recited in claim 15, wherein said edge is characterized by at least one edge radius.

17. The processing element as recited in claim 16, wherein said edge comprises one edge radius, and said edge radius ranges from 0.5 mm to 5 mm.

18. The processing element as recited in claim 17, wherein said edge radius ranges from 0.5 mm to 2 mm.

19. The processing element as recited in claim 12, wherein said first protective layer and said second protective layer comprise at least one of a surface anodization, a coating formed using plasma electrolytic oxidation, and a spray coating.

20. The processing element as recited in claim 12, wherein said first protective layer and said second protective layer comprise at least one of alumina, carbon, silicon carbide, silicon, quartz, Teflon, Vespel, and Kapton.

21. The processing element as recited in claim 12, wherein said first protective barrier and said second protective barrier comprise at least one of a III-column element and a Lanthanon element.

22. The processing element as recited in claim 12, wherein said first protective barrier and said second protective barrier comprise at least one of Yttria ($Y_2O_3$), $Sc_2O_3$, $Sc_2F_3$, $YF_3$, $La_2O_3$, $CeO_2$, $Eu_2O_3$, and $Dy_2O_3$.

23. The processing element as recited in claim 12, wherein said first protective barrier comprises a surface anodization, and said second protective barrier comprises a spray coating.

24. The processing element as recited in claim 12, wherein the first and second protective barriers comprise the same material.

25. The processing element as recited in claim 12, wherein the first and second protective barriers comprise different materials.

* * * * *